United States Patent
Yosui (10) Patent No.: US 9,113,556 B2
(45) Date of Patent: Aug. 18, 2015

(54) FLEXIBLE BOARD AND ELECTRONIC DEVICE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/499,501

(22) Filed: Sep. 29, 2014

(65) Prior Publication Data

US 2015/0018055 A1    Jan. 15, 2015

Related U.S. Application Data (63) Continuation of application No. PCT/JP2013/083329, filed on Dec. 12, 2013.

(30) Foreign Application Priority Data

Dec. 12, 2012  (JP) .................. 2012-270938

(51) Int. Cl.
| | | |
|---|---|---|
| *H04M 1/00* | (2006.01) | |
| *H05K 1/02* | (2006.01) | |
| *H04M 1/02* | (2006.01) | |
| *H05K 1/11* | (2006.01) | |
| *H05K 5/00* | (2006.01) | |

(52) U.S. Cl.
CPC ........... *H05K 1/0237* (2013.01); *H04M 1/0202* (2013.01); *H05K 1/02* (2013.01); *H05K 1/115* (2013.01); *H05K 5/0026* (2013.01); *H05K 2201/055* (2013.01); *H05K 2201/10189* (2013.01)

(58) Field of Classification Search
CPC ......... H05K 1/02; H05K 1/028; H05K 1/147; H05K 1/118; H04M 1/0202
USPC .................... 455/575.1, 550.1; 361/749, 751; 174/254, 255
See application file for complete search history.

(56) References Cited

U.S. PATENT DOCUMENTS

| | | | |
|---|---|---|---|
| 2007/0089900 A1* | 4/2007 | Mitamura et al. ............ | 174/254 |
| 2009/0002829 A1* | 1/2009 | Shinohara ..................... | 359/565 |
| 2010/0197368 A1* | 8/2010 | Kawate et al. ............. | 455/575.1 |
| 2012/0274423 A1 | 11/2012 | Kato | |

FOREIGN PATENT DOCUMENTS

| | | |
|---|---|---|
| JP | 2008-235593 A | 10/2008 |
| JP | 2009-176901 A | 8/2009 |
| WO | 2012/073591 A1 | 6/2012 |

OTHER PUBLICATIONS

Official Communication issued in International Patent Application No. PCT/JP2013/083329, mailed on Mar. 11, 2014.

* cited by examiner

*Primary Examiner* — Khai M Nguyen
(74) *Attorney, Agent, or Firm* — Keating & Bennett, LLP (57) ABSTRACT

A flexible board includes a flexible body and a linear conductor. The flexible body includes a first main surface and a second main surface. The linear conductor is provided at the flexible body so as to be located closer to the first main surface than to the second main surface. The flexible body is valley-folded along a line crossing the linear conductor such that the first main surface is located inside of the fold, and is mountain-folded along a line crossing the linear conductor such that the first main surface is outside of the fold. An average radius of curvature in an area where the flexible body is mountain-folded is greater than an average radius of curvature in an area where the flexible body is valley-folded.

20 Claims, 6 Drawing Sheets

FLEXIBLE BOARD AND ELECTRONIC DEVICE

BACKGROUND OF THE INVENTION

1. Field of the Invention

The present invention relates to a flexible board and an electronic device, and more particularly to a flexible board including a linear conductor in a flexible body, and an electronic device.

2. Description of the Related Art

As a conventional flexible board, for example, a high-frequency signal line disclosed by WO 2012/073591 is known. The high-frequency signal line includes a dielectric body, a signal line and two ground conductors. The dielectric body is a laminate of dielectric sheets. The signal line is located in the dielectric body. The two ground conductors are located in the dielectric body so as to sandwich the signal line in the direction of lamination. Accordingly, the signal line and the two ground conductors form a stripline structure.

One of the ground conductors has a plurality of openings at positions over the signal line when viewed from the direction of lamination. Thereby, little capacitance is created between the signal line and the ground conductor. Therefore, it is possible to reduce the distance in the direction of lamination between the signal line and the ground conductor having the openings, and it is possible to make the high-frequency signal line thinner. This high-frequency signal line is used, for example, to connect two circuit boards.

The dielectric body of the high-frequency signal line disclosed by WO 2012/073591 is flexible, and the high-frequency signal line is bent when used. When the high-frequency signal line is bent, the signal line located in the dielectric body is stretched and/or compressed, and the signal line may be broken.

SUMMARY OF THE INVENTION

Preferred embodiments of the present invention provide a flexible board and an electronic device capable of diminishing the risk of breakage of a signal line.

A flexible board according to a preferred embodiment of the present invention includes a flexible body including a first main surface and a second main surface, and a linear conductor provided at the flexible body so as to be located closer to the first main surface than to the second main surface. The flexible body is valley-folded along a line crossing the linear conductor such that the first main surface is located inside of the fold, and is mountain-folded along a line crossing the linear conductor such that the first main surface is located outside of the fold, and an average radius of curvature in an area where the flexible body is mountain-folded is greater than an average radius of curvature in an area where the flexible body is valley-folded.

An electronic device according to a preferred embodiment of the present invention includes a case, and a flexible board housed in the case. The flexible board includes a flexible body including a first main surface and a second main surface, and a linear conductor provided at the flexible body so as to be located closer to the first main surface than to the second main surface. The flexible body is valley-folded along a line crossing the linear conductor such that the first main surface is located inside of the fold, and is mountain-folded along a line crossing the linear conductor such that the first main surface is located outside of the fold, and an average radius of curvature in an area where the flexible body is mountain-folded is greater than an average radius of curvature in an area where the flexible body is valley-folded.

Various preferred embodiments of the present invention prevent breakage of a signal line.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A high-frequency signal line and an electronic device according to preferred embodiments of the present invention are hereinafter described with reference to the drawings.

Figure 1:
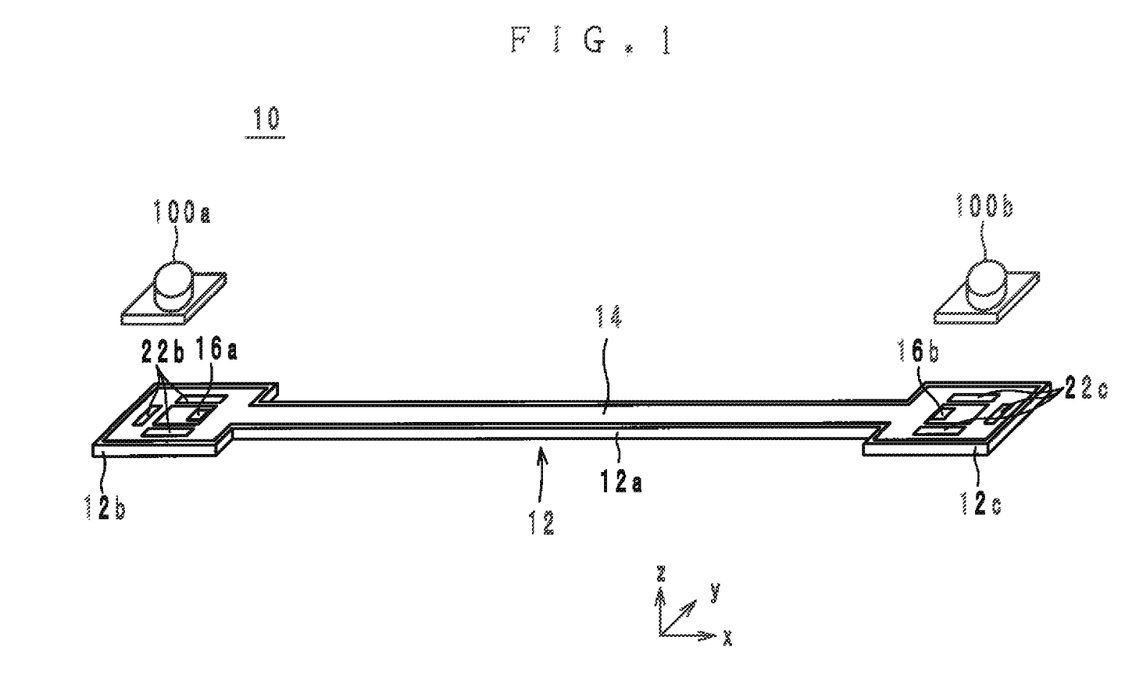
FIG. 1 is a perspective view of a high-frequency signal line according to a preferred embodiment of the present invention.
Figure 2:
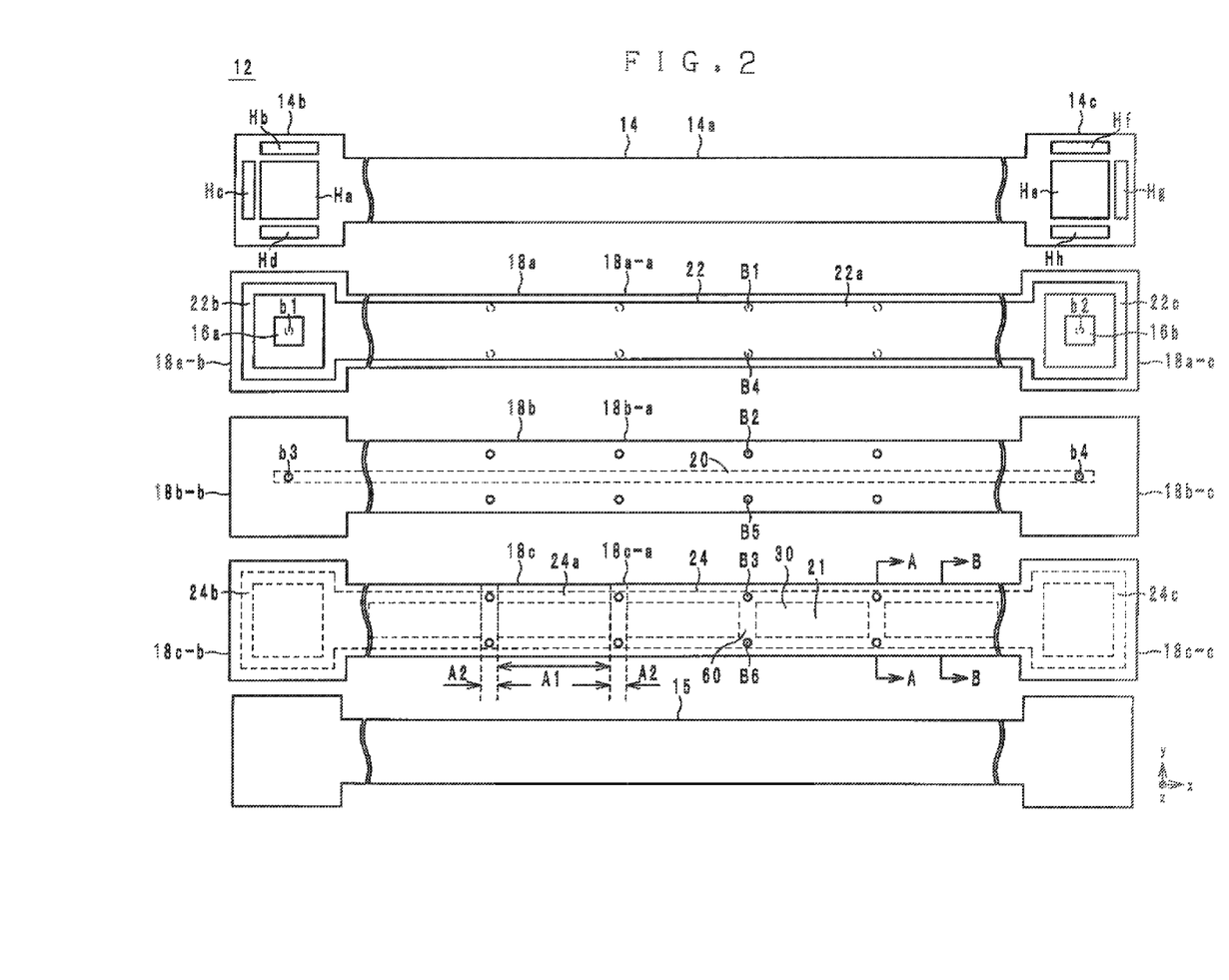
FIG. 2 is an exploded view of a dielectric body of the high-frequency signal line illustrated in FIG. 1.
Figure 3:
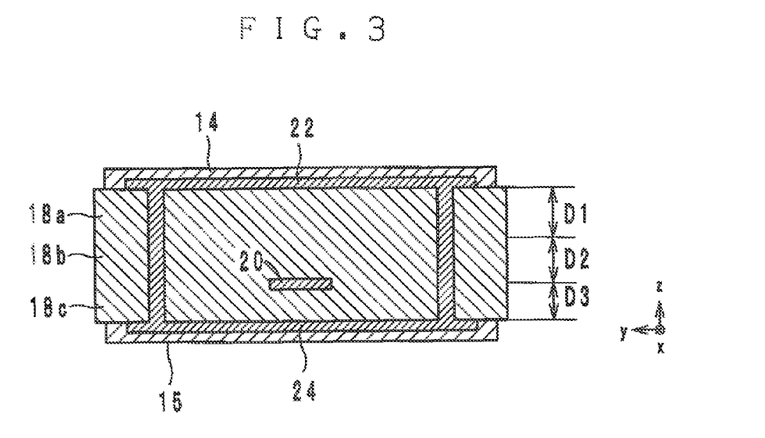
FIG. 3 is a sectional view cut along the line A-A indicated in FIG. 2.
Figure 4:
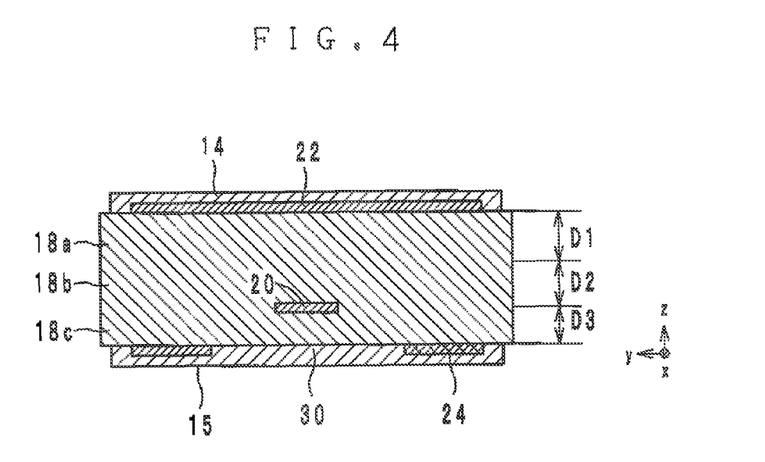
FIG. 4 is a sectional view cut along the line B-B indicated in FIG. 2.

The structure of a high-frequency signal line 10 according to a preferred embodiment of the present invention is described with reference to the drawings. FIG. 1 is a perspective view of the high-frequency signal line 10 according to the present preferred embodiment. FIG. 2 is an exploded view of a dielectric body 12 of the high-frequency signal line 10. FIG. 3 is a sectional view cut along the line A-A indicated in FIG. 2. FIG. 4 is a sectional view cut along the line B-B indicated in FIG. 2. In the following, the direction of lamination of the high-frequency signal line 10 is defined as a z-direction. The lengthwise direction of the high-frequency signal line 10 is defined as an x-direction, and the direction perpendicular to the x-direction and the z-direction is defined as a y-direction.

The high-frequency signal line 10 is a flexible board that is used, for example, to connect two high-frequency circuits in an electronic device such as a cell phone. As illustrated in FIGS. 1 through 3, the high-frequency signal line 10 includes a dielectric body 12, external terminals 16a and 16b, a signal line 20, a main ground conductor 22, an auxiliary ground conductor 24, via-hole conductors b1 through b4 and B1 through B6, and connectors 100a and 100b.

The dielectric body 12 is, as illustrated in FIG. 1, a flexible plate-shaped member extending in the x-direction when viewed from the z-direction. The dielectric body 12 includes a line portion 12a, and connecting portions 12b and 12c. As illustrated in FIG. 2, the dielectric body 12 is a laminate including a protective layer 14, dielectric sheets 18a through 18c, and a protective layer 15 laminated in this order from a positive side to a negative side in the z-direction. A main surface of the dielectric body 12 on the positive side in the z-direction is hereinafter referred to as an obverse surface (second main surface), and a main surface of the dielectric body 12 on the negative side in the z-direction is hereinafter referred to as a reverse surface (first main surface).

The line portion 12a, as seen in FIG. 1, extends in the x-direction. The connecting portions 12b and 12c preferably are rectangular or substantially rectangular portions connected to a negative end and a positive end in the x-direction of the line portion 12a, respectively. The widths (sizes in the y-direction) of the connecting portions 12b and 12c are greater than the width (sizes in the y-direction) of the line portion 12a.

As illustrated in FIG. 2, the dielectric sheets 18a through 18c have the same shape as the dielectric body 12 when viewed from the z-direction. The dielectric sheets 18a through 18c are preferably made of flexible thermoplastic resin, such as polyimide, liquid polymer or the like. In the following, a main surface of each of the dielectric sheets 18a through 18c on the positive side in the z-direction is referred to as an upper surface, and a main surface of each of the dielectric sheets 18a through 18c on the negative side in the z-direction is referred to as a lower surface.

As indicated in FIGS. 3 and 4, the total of the thickness D1 of the dielectric sheet 18a and the thickness D2 of the dielectric sheet 18b is greater than the thickness D3 of the dielectric sheet 18c. After a laminating process of the dielectric sheets 18a through 18c, the total of the thickness D1 and the thickness D2 preferably is, for example, within a range from about 50 µm to about 300 µm. In this preferred embodiment, the total of the thickness D1 and the thickness D2 preferably is about 150 µm, for example. The thickness D1 preferably is about 75 µm, and the thickness D2 preferably is about 75 µm, for example. The thickness D3 preferably is, for example, within a range from about 10 µm to about 100 µm, for example. In this preferred embodiment, the thickness D2 preferably is about 50 µm, for example.

As illustrated in FIG. 2, the dielectric sheet 18a includes a line portion 18a-a, and connecting portions 18a-b and 18a-c. The dielectric sheet 18b includes a line portion 18b-a, and connecting portions 18b-b and 18b-c. The dielectric sheet 18c includes a line portion 18c-a, and connecting portions 18c-b and 18c-c. The line portions 18a-a, 18b-a and 18c-a constitute the line portion 12a. The line portions 18a-b, 18b-b and 18c-b constitute the connecting portion 12b. The line portions 18a-c, 18b-c and 18c-c constitute the connecting portion 12c.

The signal line 20 is, as illustrated in FIGS. 2 through 4, a linear conductor located in the dielectric body 12, and the signal line 20 is to transmit a high-frequency signal. In this preferred embodiment, the signal line 20 is a linear conductor provided on the lower surface of the dielectric sheet 18b to extend in the x-direction. Accordingly, the signal line 20 is, as seen in FIGS. 3 and 4, located closer to the reverse surface of the dielectric body 12 than to the obverse surface of the dielectric body 12.

The negative end in the x-direction of the signal line 20 is, as seen in FIG. 2, in the center of the connecting portion 18b-b. The positive end in the x-direction of the signal line 20 is, as seen in FIG. 2, in the center of the connecting portion 18b-c. The signal line 20 is preferably made of a metal material with a low specific resistance including mainly silver or copper. The statement that the signal line 20 is provided on the lower surface of the dielectric sheet 18b means that the signal line 20 is preferably formed by plating the lower surface of the dielectric sheet 18b with a metal foil and by patterning the metal foil or that the signal line 20 is preferably formed by applying a metal foil on the lower surface of the dielectric sheet 18b and by patterning the metal foil. The surface of the signal line 20 is smoothened, and therefore, the surface of the signal line 20 in contact with the dielectric sheet 18b has a greater surface roughness than the surface of the signal line 20 out of contact with the dielectric sheet 18b.

As illustrated in FIGS. 2 through 4, the main ground conductor (second ground conductor) 22 is a continuous conductor layer located between the signal line 20 and the obverse surface of the dielectric body 12. More specifically, the main ground conductor 22 is provided on the upper surface of the dielectric sheet 18a to face the signal line 20 via the dielectric sheets 18a and 18b. The main ground conductor 22 has no openings at positions over the signal line 20. The main conductor 22 is preferably made of a metal material with a low specific resistance containing mainly of silver or copper.

The statement that the main ground conductor 22 is provided on the upper surface of the dielectric sheet 18a means that the main ground conductor 22 is preferably formed by plating the upper surface of the dielectric sheet 18a with a metal foil and preferably by patterning the metal foil or that the main ground conductor 22 is formed preferably by applying a metal foil on the upper surface of the dielectric sheet 18a and by patterning the metal foil. The surface of the main ground conductor 22 is smoothened, and therefore, the surface of the main ground conductor 22 in contact with the dielectric sheet 18a has a greater surface roughness than the surface of the main ground conductor 22 out of contact with the dielectric sheet 18a.

As illustrated in FIG. 2, the main ground conductor 22 includes a main conductor 22a, and terminal conductors 22b and 22c. The main conductor 22a is provided on the upper surface of the line portion 18a-a to extend in the x-direction. The terminal conductor 22b is provided on the upper surface of the connecting portion 18a-b and preferably is rectangular or substantially rectangular ring-shaped. The terminal conductor 22b is connected to the negative end in the x-direction of the main conductor 22a. The terminal conductor 22c is provided on the upper surface of the connecting portion 18a-c and preferably is rectangular or substantially rectangular ring-shaped. The terminal conductor 22c is connected to the positive end in the x-direction of the main conductor 22a.

The characteristic impedance of the high-frequency signal line 10 is determined mainly depending on the area where the signal line 20 and the main ground conductor 22 face each other, the distance between the signal line 20 and the main ground conductor 22 and the relative permittivity of the dielectric sheets 18a through 18c. Therefore, in a case where the high-frequency signal line 10 is intended to have characteristic impedance of about 50Ω, for example, the characteristic impedance of the high-frequency signal line 10 determined from the signal line 20 and the main ground conductor 22 is set, for example, to about 55Ω that is a little higher than about 50Ω, for example. Then, the configuration (sizes and shapes of openings 30) of the auxiliary ground conductor 24 is adjusted such that the characteristic impedance of the high-frequency signal line 10 determined from the signal line 20, the main ground conductor 22 and the auxiliary ground conductor 24 will be about 50Ω, for example. The configuration of the auxiliary ground conductor 24 will be described later. Thus, the continuous conductor layer 22 defines and functions as a main ground conductor.

As illustrated in FIG. 2, the auxiliary ground conductor 24 is a conductor layer located between the signal line 20 and the reverse surface of the dielectric body 12. More specifically, the auxiliary ground conductor 24 is provided on the lower surface of the dielectric sheet 18c to face the signal line 20 via the dielectric sheet 18c. The auxiliary ground conductor 24 is preferably made of a metal material with a low specific resistance containing mainly of silver or copper.

The statement that the auxiliary ground conductor 24 is provided on the lower surface of the dielectric sheet 18c means that the auxiliary ground conductor 24 is preferably formed by plating the lower surface of the dielectric sheet 18c with a metal foil and preferably by patterning the metal foil or that the auxiliary ground conductor 24 is formed preferably by applying a metal foil on the lower surface of the dielectric sheet 18c and by patterning the metal foil. The surface of the auxiliary ground conductor 24 is smoothened, and therefore, the surface of the auxiliary ground conductor 24 in contact with the dielectric sheet 18c has a greater surface roughness than the surface of the auxiliary ground conductor 24 out of contact with the dielectric sheet 18c.

As illustrated in FIG. 2, the auxiliary ground conductor 24 includes a main conductor 24a, and terminal conductors 24b and 24c. The main conductor 24a is provided on the lower surface of the line portion 18c-a to extend in the x-direction. The terminal conductor 24b is provided on the lower surface of the connecting portion 18c-b and preferably is rectangular or substantially rectangular ring-shaped. The terminal conductor 24b is connected to the negative end in the x-direction of the main conductor 24a. The terminal conductor 24c is provided on the lower surface of the connecting portion 18c-c and is preferably is rectangular or substantially rectangular ring-shaped. The terminal conductor 24c is connected to the positive end in the x-direction of the main conductor 24a.

As illustrated in FIG. 2, the main conductor 24a includes rectangular or substantially rectangular openings 30 aligned in the x-direction. Accordingly, the main conductor 24a is shaped like a ladder. In the main conductor 24a, the portions between the openings 30 are referred to as bridges 60. Each of the bridges 60 extends in the y-direction. When viewed from the z-direction, the openings 30 and the bridges 60 are arranged alternately to be overlapped with the signal line 20. In this preferred embodiment, the signal line 20 extends across the openings 30 and the bridges 60 in the center of the openings 30 and the bridges 60 with respect to the y-direction.

The auxiliary ground conductor 24 also functions as a shield. As mentioned above, the auxiliary ground conductor 24 is designed for final adjustment of the characteristic impedance of the high-frequency signal line 10 such that the characteristic impedance will be about 50Ω, for example.

As described above, the main ground conductor 22 does not have any openings, and the auxiliary ground conductor 24 includes the openings 30. Therefore, the area where the auxiliary ground conductor 24 faces the signal line 20 is smaller than the area where the main ground conductor 22 faces the signal line 20.

As seen in FIG. 2, the external terminal 16a is a rectangular or substantially rectangular conductor provided in the center of the upper surface of the connecting portion 18a-b of the dielectric sheet 18a. When viewed from the z-direction, the external terminal 16a is located over the negative end in the x-direction of the signal line 20. As seen in FIG. 2, the external terminal 16b is a rectangular or substantially rectangular conductor provided in the center of the upper surface of the connecting portion 18a-c of the dielectric sheet 18a. When viewed from the z-direction, the external terminal 16b is located over the positive end in the x-direction of the signal line 20. The external terminals 16a and 16b are preferably made of a metal material with a low specific resistance containing mainly of silver or copper. The surfaces of the external terminals 16a and 16b are plated with Ni/Au.

The statement that the external terminals 16a and 16b are provided on the upper surface of the dielectric sheet 18a means that the external terminals 16a and 16b are formed preferably by plating the upper surface of the dielectric sheet 18a with a metal foil and preferably by patterning the metal foil or that the external terminals 16a and 16b are formed preferably by applying a metal foil on the upper surface of the dielectric sheet 18a and by patterning the metal foil. The surfaces of the external terminals 16a and 16b are smoothened, and therefore, the respective surfaces of the external terminals 16a and 16b in contact with the dielectric sheet 18a have a greater surface roughness than the respective surfaces of the external terminals 16a and 16b out of contact with the dielectric sheet 18a.

The external terminals 16a, 16b, the signal line 20, the main ground conductor 22 and the auxiliary ground conductor 24 have thicknesses equal or substantially equal to one another. The thicknesses of the external terminals 16a, 16b, the signal line 20, the main ground conductor 22 and the auxiliary ground conductor 24 preferably are, for example, within a range from about 10 μm to about 20 μm.

As described above, the signal line 20 is sandwiched between the main ground conductor 22 and the auxiliary ground conductor 24 from the both sides in the z-direction. Thus, the signal line 20, the main ground conductor 22 and the auxiliary ground conductor 24 define a triplate stripline structure. The interval (distance in the z-direction) between the signal line 20 and the main ground conductor 22 is, as illustrated in FIGS. 3 and 4, equal or substantially equal to the total of the thickness D1 of the dielectric sheet 18a and the thickness D2 of the dielectric sheet 18b, and the interval preferably is, for example, within a range from about 50 μm to about 300 μm. In this preferred embodiment, the interval between the signal line 20 and the main ground conductor 22 preferably is about 150 μm, for example. The interval (distance in the z-direction) between the signal line 20 and the auxiliary ground conductor 24 is, as illustrated in FIGS. 3 and 4, equal or substantially equal to the thickness D3 of the dielectric sheet 18c, and the interval preferably is, for example, within a range from about 10 μm to about 100 μm. In this preferred embodiment, the interval between the signal line 20 and the auxiliary ground conductor 24 preferably is about 50 μm. Thus, the distance in the z-direction between the auxiliary ground conductor 24 and the signal line 20 is smaller than the distance in the z-direction between the main ground conductor 22 and the signal line 20.

The via-hole conductors B1 are, as seen in FIG. 2, pierced in the dielectric sheet 18a in the z-direction. The via-hole conductors B1 are located farther in the positive y-direction than the signal line 20 and are aligned in the x-direction. As seen in FIG. 2, the via-hole conductors B2 are pierced in the dielectric sheet 18b in the z-direction. The via-hole conductors B2 are located farther in the positive y-direction than the signal line 20 and are aligned in the x-direction. As seen in FIG. 2, the via-hole conductors B3 are pierced in the dielectric sheet 18c in the z-direction. The via-hole conductors B3 are located farther in the positive y-direction than the signal line 20 and are aligned in the x-direction. The via-hole conductors B1 are connected to the respectively adjacent via-hole conductors B2, and the via-hole conductors B2 are connected to the respective adjacent via-hole conductors B3. Thus, each connected set of via-hole conductors B1 through B3 defines and serves as one via-hole conductor. The respective positive ends in the z-direction of the via-hole conductors B1 are connected to the main ground conductor 22. The respective negative ends in the z-direction of the via-hole conductors B3 are connected to the auxiliary ground conductor 24, and more specifically to the respective positive sides in the y-direction of the bridges 60. The via-hole conductors B1 through B3 are formed preferably by filling via-holes made in the dielectric sheets 18a through 18c with conductive paste including silver, tin, copper or the like and by solidifying the conductive paste.

The via-hole conductors B4 are, as seen in FIG. 2, pierced in the dielectric sheet 18a in the z-direction. The via-hole conductors B4 are located farther in the negative y-direction than the signal line 20 and are aligned in the x-direction. As seen in FIG. 2, the via-hole conductors B5 are pierced in the dielectric sheet 18b in the z-direction. The via-hole conductors B5 are located farther in the negative y-direction than the signal line 20 and are aligned in the x-direction. As seen in FIG. 2, the via-hole conductors B6 are pierced in the dielectric sheet 18c in the z-direction. The via-hole conductors B6 are located farther in the negative y-direction than the signal line 20 and are aligned in the x-direction. The via-hole conductors B4 are connected to the respectively adjacent via-hole conductors B5, and the via-hole conductors B5 are connected to the respective adjacent via-hole conductors B6. Thus, each connected set of via-hole conductors B4 through B6 defines and serves as one via-hole conductor. The respective positive ends in the z-direction of the via-hole conductors B4 are connected to the main ground conductor 22. The respective negative ends in the z-direction of the via-hole conductors B3 are connected to the auxiliary ground conductor 24, and more specifically to the respective negative sides in the y-direction of the bridges 60. The via-hole conductors B4 through B6 are formed preferably by filling via-holes made in the dielectric sheets 18a through 18c with conductive paste including silver, tin, copper or the like and by solidifying the conductive paste.

The via-hole conductor b1 is, as seen in FIG. 2, pierced in the connecting portion 18a-b of the dielectric sheet 18a in the z-direction. The via-hole conductor b3 is, as seen in FIG. 2, pierced in the connecting portion 18b-b of the dielectric sheet 18b in the z-direction. The via-hole conductor b1 and the via-hole conductor b3 are connected to each other and serve as one via-hole conductor. The positive end in the z-direction of the via-hole conductor b1 is connected to the external terminal 16a. The negative end in the z-direction of the via-hole conductor b3 is connected to the negative end in the x-direction of the signal line 20.

The via-hole conductor b2 is, as seen in FIG. 2, pierced in the connecting portion 18a-c of the dielectric sheet 18a in the z-direction. The via-hole conductor b3 is, as seen in FIG. 2, pierced in the connecting portion 18b-c of the dielectric sheet 18b in the z-direction. The via-hole conductor b2 and the via-hole conductor b4 are connected to each other and define and serve as one via-hole conductor. The positive end in the z-direction of the via-hole conductor b2 is connected to the external terminal 16b. The negative end in the z-direction of the via-hole conductor b4 is connected to the positive end in the x-direction of the signal line 20. Thus, the signal line 20 is connected between the external terminals 16a and 16b. The via-hole conductors b1 through b4 are formed preferably by filling via-holes made in the dielectric sheets 18a and 18b with conductive paste including silver, tin, copper or the like and by solidifying the conductive paste.

The protective layer 14 is an insulating layer that covers the substantially entire upper surface of the dielectric sheet 18a. Accordingly, the protective layer 14 covers the main ground conductor 22. The protective layer 14 is preferably made of, for example, flexible resin such as a resist material.

The protective layer 14, as illustrated in FIG. 2, includes a line portion 14a, and connecting portions 14b and 14c. The line portion 14a covers the substantially entire upper surface of the line portion 18a-a and accordingly covers the main conductor 22a.

The connecting portion 14b is connected to the negative end in the x-direction of the line portion 14a and covers the upper surface of the connecting portion 18a-b. However, the connecting portion 14b includes openings Ha through Hd. The opening Ha is a rectangular or substantially rectangular opening located in the center of the connecting portion 14b. The external terminal 16a is exposed to outside through the opening Ha. The opening Hb is a rectangular or substantially rectangular opening located farther in the positive y-direction than the opening Ha. The opening Hc is a rectangular or substantially rectangular opening located farther in the negative x-direction than the opening Ha. The opening Hd is a rectangular or substantially rectangular opening located farther in the negative y-direction than the opening Ha. The terminal conductor 22b is exposed to outside through the openings Hb through Hd and defines and functions as an external terminal.

The connecting portion 14c is connected to the positive end in the x-direction of the line portion 14a and covers the upper surface of the connecting portion 18a-c. However, the connecting portion 14c includes openings He through Hh. The opening He is a rectangular or substantially rectangular opening located in the center of the connecting portion 14c. The external terminal 16b is exposed to outside through the opening He. The opening Hf is a rectangular or substantially rectangular opening located farther in the positive y-direction than the opening He. The opening Hg is a rectangular or substantially rectangular opening located farther in the positive x-direction than the opening He. The opening Hh is a rectangular or substantially rectangular opening located farther in the negative y-direction than the opening He. The terminal conductor 22c is exposed to outside through the openings Hf through Hh and defines and functions as an external terminal.

The protective layer 15 is an insulating layer provided on the lower surface of the dielectric sheet 18c to cover the substantially entire lower surface of the dielectric sheet 18c. Accordingly, the protective layer 15 covers the auxiliary ground conductor 24. The protective layer 15 is preferably made of, for example, flexible resin such as a resist material.

In the high-frequency signal line 10 having the structure above, the characteristic impedance of the signal line 20 changes cyclically between an impedance value Z1 and an impedance value Z2. More specifically, in areas A1 where the signal line 20 is over the openings 30, relatively small capacitance is created between the signal line 20 and the auxiliary ground conductor 24. Accordingly, the characteristic impedance of the signal line 20 in the areas A1 is a relatively high value Z1.

In areas A2 where the signal line 20 is located over the bridges 90, on the other hand, relatively large capacitance is created between the signal line 20 and the auxiliary ground conductor 24. Accordingly, the characteristic impedance of the signal line 20 in the areas A2 is a relatively low value Z2. In this regard, the areas A1 and the areas A2 are arranged alternately in the x-direction, and therefore, the characteristic impedance of the signal line 20 changes cyclically between the value Z1 and the value Z2. The impedance value Z1 is, for example, about 55Ω, and the impedance value Z2 is, for example, about 45Ω. The average characteristic impedance of the whole signal line 20 is, for example, about 50 Ω.

Figure 5:
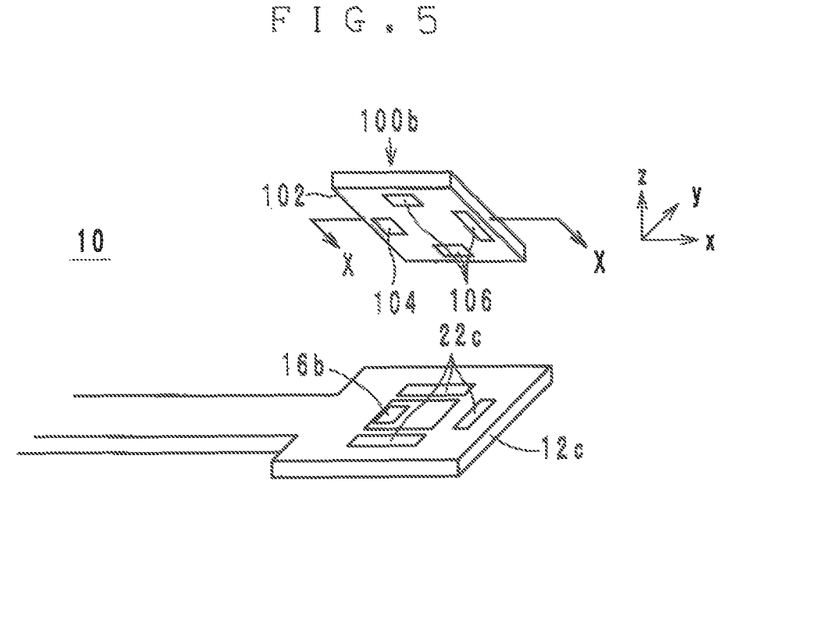
FIG. 5 is a perspective view of a connector of the high-frequency signal line.
Figure 6:
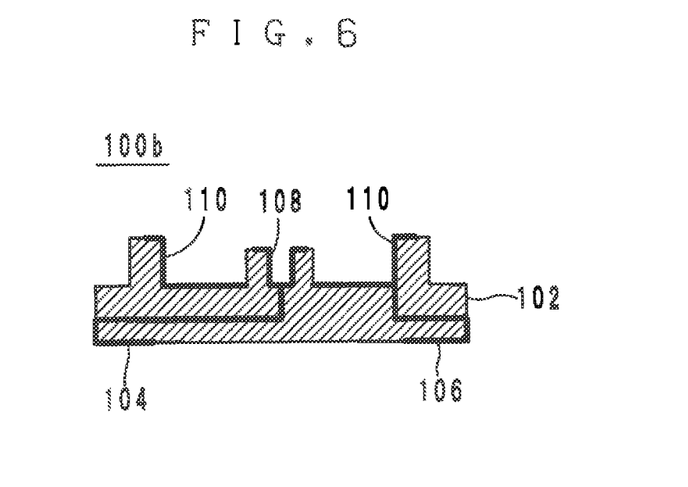
FIG. 6 is a sectional view of the connector of the high-frequency signal line.

The connectors 100a and 100b are, as illustrated in FIG. 1, mounted on the obverse surfaces of the connecting portions 12b and 12c, respectively. The connectors 100a and 100b have the same structure, and in the following, the structure of the connector 100b is described as an example. FIG. 5 is a perspective view of the connector 100b of the high-frequency signal line 10. FIG. 6 is a sectional view of the connector 100b of the high-frequency signal line 10.

The connector 100b, as illustrated in FIGS. 1, 5 and 6, includes a connector body 102, external terminals 104 and 106, a central conductor 108 and an external conductor 110. The connector body 102 is in the shape of a rectangular or substantially rectangular plate with a cylinder connected thereon, and is preferably made of an insulating material such as resin.

The external terminal 104 is provided on the surface of the plate-shaped portion of the connector body 102 on the negative side in the z-direction so as to face the external terminal 16b. The external terminal 106 is provided on the surface of the plate-shaped portion of the connector body 102 on the negative side in the z-direction so as to face the terminal conductor 22c exposed through the openings Hf through Hh.

The central conductor 108 is located in the center of the cylindrical portion of the connector body 102 and is connected to the external terminal 104. The central conductor 108 is a signal terminal at which a high-frequency signal is input or output. The external conductor 110 is provided on the inner surface of the cylindrical portion of the connector body 102 and is connected to the external terminal 106. The external conductor 110 is a ground terminal that is maintained at a ground potential.

The connector 100b having the structure above is, as illustrated in FIGS. 5 and 6, mounted on the obverse surface of the connecting portion 12c such that the external terminal 104 is connected to the external terminal 16b and such that the external terminal 106 is connected to the terminal conductor 22c. As a result, the signal line 20 is electrically connected to the central conductor 108, and the main ground conductor 22 and the auxiliary ground conductor 24 are electrically connected to the external conductor 110.

Figure 7:
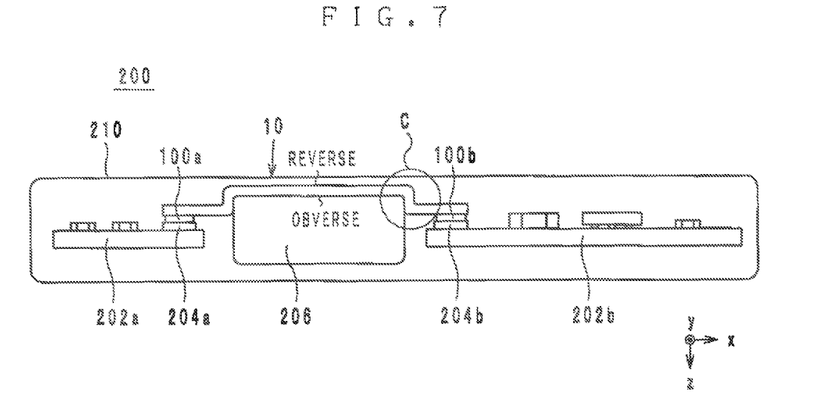
FIG. 7 is a plan view from a y-direction of an electronic device including the high-frequency signal line.
Figure 8:
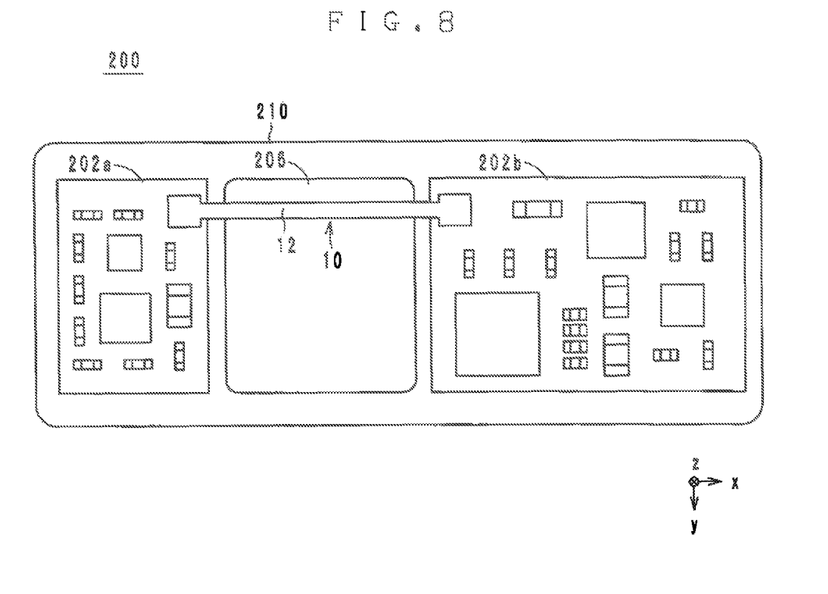
FIG. 8 is a plan view from a z-direction of the electronic device including the high-frequency signal line.
Figure 9:
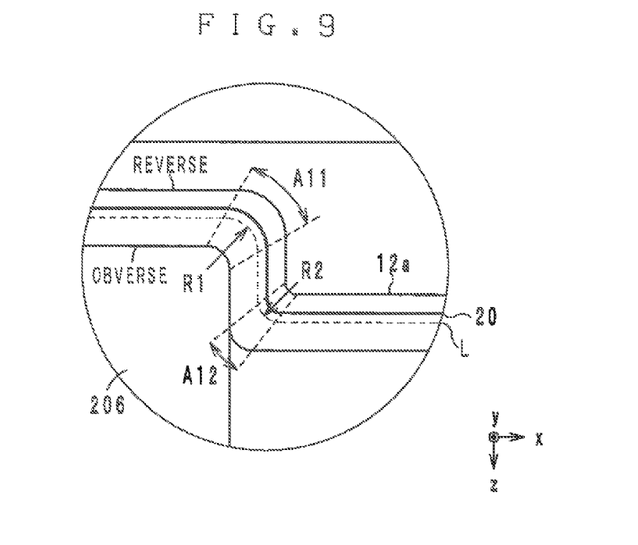
FIG. 9 is an enlarged view of the portion C indicated in FIG. 7.

The high-frequency signal line 10 is preferably used in the following way. FIG. 7 is a plan view from the y-direction of an electronic device 200 including the high-frequency signal line 10. FIG. 8 is a plan view from the z-direction of the electronic device 200 including the high-frequency signal line 10. FIG. 9 is an enlarged view of the portion C indicated in FIG. 7.

The electronic device 200 includes the high-frequency signal line 10, circuit boards 202a and 202b, receptacles 204a and 204b, a battery pack (metal object) 206, and a case 210.

As illustrated in FIGS. 7 and 8, the case 210 houses the high-frequency signal line 10, the circuit boards 202a and 202b, the receptacles 204a and 204b, and the battery pack 206. In the circuit board 202a, for example, a transmitting circuit or a receiving circuit including an antenna is provided. In the circuit board 202b, for example, a feed circuit is provided. The battery pack 206 is, for example, a lithium-ion secondary battery, and the surface of the battery pack 206 is covered by a metal cover. The circuit board 202a, the battery pack 206 and the circuit board 202b are arranged in this order from the negative side to the positive side in the x-direction.

The receptacles 204a and 204b are provided on respective main surfaces of the circuit boards 202a and 202b on the negative side in the z-direction. The connectors 100a and 100b are connected to the receptacles 204a and 204b respectively. In this moment, the line portion 12a is bent as described below.

As seen in FIG. 7, the dielectric body 12a is bent in a portion further in the positive x-direction than the center. In this portion, the line portion 12a is mountain-folded along a line crossing the signal line 20 such that the reverse surface of the dielectric body 12 is located outside of the fold. As a result, the dielectric body 12 is bent so as to extend on the surface of the battery pack 206 on the negative side in the z-direction and on the side surface of the battery pack 206 on the positive side in the x-direction. As indicated in FIG. 9, the area where the dielectric body 12 is mountain-folded is hereinafter referred to as an area A11.

As seen FIG. 7, the line portion 12a is also bent in a portion further in the positive x-direction than the area A11. In this portion, the line portion 12a is valley-folded along a line crossing the signal line 20 such that the reverse surface of the dielectric body 12 is inside of the fold. As a result, the dielectric body 12 is bent so as to further extend from the side surface of the battery pack 206 on the positive side in the x-direction to the main surface of the circuit board 202 on the positive side in the z-direction. As indicated in FIG. 9, the area where the dielectric body 12 is valley-folded is hereinafter referred to as an area A12.

In this regard, the average radius of curvature R1 in the area A11 is greater than the average radius of curvature R2 in the area A12. In this preferred embodiment, the radius of curvature means the radius of curvature of an imaginary line L passing through the center of the dielectric body 12 with respect to the z-direction. With the structure of the high-frequency signal line 10, breakage of the signal line 20 is reliably prevented as described below.

As in the portion of the dielectric body 12a farther in the positive x-direction than the center, the dielectric body 12a is also mountain-folded and valley-folded in a portion farther in the negative x-direction than the center. The folds of the dielectric body 12a in the portion farther in the negative x-direction than the center are similar to the folds of the dielectric body 12a in the portion farther in the positive x-direction than the center, and a description thereof is omitted.

When the connectors 100a and 100b are connected to the receptacles 204a and 204b respectively, a high-frequency signal with a frequency of, for example, 2 GHz transmitted between the circuit boards 202a and 202b is applied to the central conductors 108 of the connectors 100a and 100b through the receptacles 204a and 204b. The respective external terminals 110 of the connectors 100a and 100b are maintained at the ground potential through the circuit boards 202a and 202b, and the receptacles 204a and 204b. In this way, the high-frequency signal line 10 connects the circuit boards 202a and 202b to each other.

In this state, the obverse surface of the dielectric body 12 (specifically, the protective layer 14) is in contact with the battery 206, and the dielectric body 12 is fixed to the battery pack 206 by an adhesive. Accordingly, the continuous main ground conductor 22 having no openings is located between the signal line 20 and the battery pack 206.

With reference to the drawings, a non-limiting example of a method of producing the high-frequency signal line 10 is described below. In the following, a producing method of one high-frequency signal line 10 is described as a non-limiting example. Practically, however, by laminating large-size dielectric sheets and by cutting the laminate, a plurality of high-frequency signal lines 10 are produced at one time.

First, dielectric sheets, each formed of thermoplastic resin and having a copper foil (metal film) entirely on one main surface, are prepared as the dielectric sheets 18a through 18c. Specifically, copper foils are applied to the respective one main surface of the dielectric sheets 18a through 18c. The surfaces of the copper foils are, for example, galvanized for corrosion proof and thus are smoothened. The dielectric sheets 18a through 18c are formed of liquid polymer. The thicknesses of the copper foils are within a range from about 10 μm to about 20 μm, for example.

Next, the external terminals 16a and 16b, and the main ground conductor 22 as illustrated in FIG. 2 are formed on the upper surface of the dielectric sheet 18a by patterning the copper foil formed on the upper surface of the dielectric sheet 18a. Specifically, resists having identical shapes to the external terminals 16a and 16b, and the main ground conductor 22 are printed on the copper foil on the upper surface of the dielectric sheet 18a. Then, the copper foil is etched, so that the portions of the copper foil not covered by the resists are removed. Thereafter, the resists are removed. In this way, the external terminals 16a and 16b, and the main ground conductor 22 as illustrated in FIG. 2 are formed on the upper surface of the dielectric sheet 18a by photolithography.

Next, the signal line 20 as illustrated in FIG. 2 is formed on the lower surface of the dielectric sheet 18b. Further, the auxiliary ground conductor 24 as illustrated in FIG. 2 is formed on the lower surface of the dielectric sheet 18c. The process for forming the signal line 20 and the process for forming the auxiliary ground conductor 24 are the same as the process for forming the external terminals 16a and 16b, and the main ground conductor 22, and descriptions of the processes are omitted here.

Next, the dielectric sheets 18a through 18c are exposed to laser beams such that through holes are made in the dielectric sheets 18a through 18c at the positions of the via-hole conductors b1 through b4 and B1 through B6. Thereafter, conductive paste is filled in the through holes, and thus, the via-hole conductors b1, b2 and B1 through B4 are formed.

Next, the dielectric sheets 18a through 18c are laminated in this order from the positive side to the negative side in the z-direction, and heat and pressure are applied to the laminated dielectric sheets 18a through 18c from the positive and negative sides in the z-direction. By the heat and pressure treatment, the dielectric sheets 18a through 18c are softened, and the conductive paste filled in the through holes is solidified. Thus, the dielectric sheets 18a through 18c are joined together, and the via-hole conductors b1 through b4 and B1 through B6 are formed.

Next, resin (resist) paste is applied to the upper surface of the dielectric sheet 18a by screen printing as illustrated in FIG. 2, and thus, the protective layer 14 covering the main ground conductor 22 is formed.

Next, resin (resist) paste is applied to the lower surface of the dielectric sheet 18c by screen printing as illustrated in FIG. 2, and thus, the protective layer 15 covering the auxiliary ground conductor 24 is formed.

Next, the connector 100a is mounted on the connecting portion 12b and soldered to the external terminal 16a and the terminal conductor 22b, and the connector 100b is mounted on the connecting portion 12c and soldered to the external terminal 16b and the terminal conductor 22c.

Figure 10:
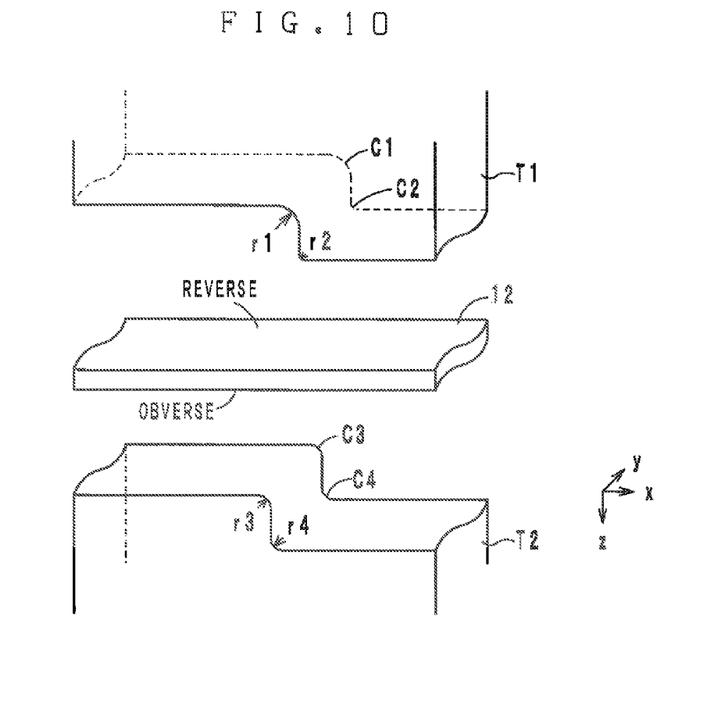
FIG. 10 illustrates a process of bending the high-frequency signal line.

Next, the line portion 12a is pinched between pressing tools T1 and T2 from the both sides in the z-direction such that the line portion 12a is mountain-folded and valley-folded in the portions near the both ends in the x-direction. Specifically, the pressing tool T1 is a tool configured to come into contact with the reverse surface of the line portion 12a and includes stair-step surfaces for the mountain-fold and valley-fold of the line portion 12a. In the following, the corner at the bottom of the valley of the pressing tool T1 is referred to as a corner C1, and the corner at the top of the mountain of the pressing tool T1 is referred to as a corner C2. The corners C1 and C2 are chamfered. The radius of curvature of the corner C1 is r1, and the radius of curvature of the corner C2 is r2.

The pressing tool T2 is a tool configured to come into contact with the obverse surface of the line portion 12a and includes stair-step surfaces for the mountain-fold and valley-fold of the line portion 12a. In the following, the corner at the top of the mountain of the pressing tool T2 is referred to as a corner C3, and the corner at the bottom of the valley of the pressing tool T2 is referred to as a corner C4. The corners C3 and C4 are chamfered. The radius of curvature of the corner C3 is r3, and the radius of curvature r3 is greater than the average radius of curvature r2. The radius of curvature of the corner C4 is r4, and the radius of curvature r1 is greater than the average radius of curvature r4.

The pressing tools T1 and T2 are placed such that the corners C1 and C3 substantially engage with each other and such that the corners C2 and C4 substantially engage with each other. Then, the line portion 12a is pinched between the pressing tools T1 and T2 from the both sides in the z-direction. It is preferred that heaters are embedded in the respective pressing tools T1 and T2 so as to heat the line portion 12a. By these tools T1 and T2, the line portion 12a is mountain-folded and valley-folded. Consequently, the radius of curvature R1 in the areas A11 where the dielectric body 12 is mountain-folded becomes larger than the radius of curvature R2 in the area A12 where the dielectric body 12 is valley-folded. The high-frequency signal line 10 after undergoing the mountain-fold and valley-fold process is connected to the receptacles 204a and 204b.

In the high-frequency signal line 10 having the structure above, breakage of the signal line 20 is reliably prevented. Specifically, in the high-frequency signal line disclosed by WO 2012/073591, the signal line provided in the dielectric body is located closer to a first main surface of the dielectric body than to a second main surface. Therefore, when the high-frequency signal line is mountain-folded such that the first main surface comes outside, the signal line 20 is stretched. When the high-frequency signal line is valley-folded such that the first main surface comes inside, the signal line is compressed. In this regard, breakage of the signal line is more likely to occur when the signal line is stretched than when the signal line is compressed.

In the light of this fact, in the high-frequency signal line 10, as illustrated in FIG. 9, the radius of curvature R1 in the areas A11 where the dielectric body 12 is mountain-folded is greater than the radius of curvature R2 in the areas A12 where the dielectric body 12 is valley-folded. With this arrangement, in the areas A11, the stretch of the signal line 20 is kept at a small extent. Consequently, in the high-frequency signal line 10, breakage of the signal line 20 is reliably prevented.

Further, it is possible to make the high-frequency signal line 10 thinner. Specifically, in the high-frequency signal line 10, in the areas A1, the signal line 20 is not overlapped with the auxiliary ground conductor 24. Accordingly, in the areas A1, little capacitance is created between the signal line 20 and the auxiliary ground conductor 24. Therefore, even a reduction in the distance between the signal line 20 and the auxiliary ground conductor 24 will not cause a significant increase in the capacitance between the signal line 20 and the auxiliary ground conductor 24 and will not result in a significant shift of the characteristic impedance of the signal line 20 from a designed value (for example, about 50Ω). Thus, it is possible to make the high-frequency signal line 10 thinner while maintaining the characteristic impedance of the signal line 20 at a designed value.

Even when the high-frequency signal line 10 is fixed to a metal object such as the battery pack 206, a change in the characteristic impedance is inhibited. More specifically, the high-frequency signal line 10 is fixed to the battery pack 206 such that the continuous main ground conductor 22 is located between the signal line 20 and the battery pack 206. Therefore, there is no risk that the signal line 20 and the battery pack 206 face each other via openings, and capacitance is prevented from being generated between the signal line 20 and the battery pack 206. Accordingly, the characteristic impedance of the signal line 20 is prevented from being reduced due to the fixation of the high-frequency signal line 10 to the battery pack 206.

OTHER PREFERRED EMBODIMENTS

Flexible boards and electronic devices according to the present invention are not limited to the high-frequency signal line 10 and the electronic device 200 described above, and various changes are possible within the scope of the present invention.

In the preferred embodiments described above, the protective layer 14 and 15 are formed preferably by screen printing, for example. However, the protective layers 14 and 15 may be formed by photolithography.

The connectors 100a and 100b are not indispensable for the high-frequency signal line 10. In a case where the connectors 100a and 100b are not provided, both ends of the high-frequency signal line 10 are connected to circuit boards by solder or the like. It is also possible that only the connector 100a or 100b is provided at only one end of the high-frequency signal line 10.

In the preferred embodiments described above, the connectors 100a and 100b are preferably provided on the obverse surface of the high-frequency signal line 10. However, the connectors 100a and 100b may be provided on the reverse surface of the high-frequency signal line 10. Alternatively, the connectors 100a and 100b may be provided on the obverse surface and the reverse surface, respectively, of the high-frequency signal line 10.

The main ground conductor 22 and the auxiliary ground conductor 24 are not indispensable for the high-frequency signal line 10. Neither the ground conductor 22 nor the auxiliary ground conductor 24 may be provided, or alternatively, only one of the ground conductors 22 and 24 may be provided.

The main ground conductor 22 may be provided on the upper surface of the dielectric sheet 18b.

The high-frequency signal line 10 may be used as a high-frequency signal line in an RF circuit board such as an antenna front-end module.

The signal line 20 is not necessarily to be used as a signal line to transmit a high-frequency signal. The signal line 20 may be used, for example, as a power-supply line, a ground line to be maintained at the ground potential, or the like.

As thus far described, various preferred embodiments of the present invention are useful in a flexible board and an electronic device, and provide the advantage of inhibiting breakage of a signal line.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible board comprising:
    a flexible body including a first main surface and a second main surface; and
    a linear conductor provided at the flexible body so as to be located closer to the first main surface than to the second main surface; wherein
    the flexible body is valley-folded along a line crossing the linear conductor such that the first main surface is located inside of the fold, and is mountain-folded along a line crossing the linear conductor such that the first main surface comes is located outside of the fold; and
    an average radius of curvature in an area where the flexible body is mountain-folded is greater than an average radius of curvature in an area where the flexible body is valley-folded.

2. The flexible board according to claim 1, further comprising:
    a first ground conductor provided between the linear conductor and the first main surface; and
    a second ground conductor provided between the linear conductor and the second main surface; wherein
    a distance between the first ground conductor and the linear conductor is smaller than a distance between the second ground conductor and the linear conductor.

3. The flexible board according to claim 2, wherein an area where the first ground conductor and the linear conductor face each other is smaller than an area where the second ground conductor and the linear conductor face each other.

4. The flexible board according to claim 2, wherein the first ground conductor contains no openings and the second ground conductor includes openings.

5. The flexible board according to claim 2, wherein the linear conductor, the first ground conductor and the second ground conductor define a triplate structure.

6. The flexible board according to claim 1, wherein the flexible body is made of thermoplastic resin.

7. The flexible board according to claim 1, wherein the flexible body includes a first protective layer, a plurality of dielectric sheets, and a second protective layer laminated on each other.

8. The flexible board according to claim 1, wherein the linear conductor is a signal line.

9. The flexible board according to claim 1, further comprising a plurality of via-hole conductors included in the flexible body and linear conductor.

10. The flexible board according to claim 1, further comprising first and second connectors provided at first and second ends of the flexible body, respectively.

11. An electronic device comprising:
    a first high-frequency circuit;
    a second high-frequency circuit; and
    the flexible board according to claim 1 arranged to connected the first and second high-frequency circuits.

12. The electronic device according to claim 11, wherein the electronic device is a cell phone.

13. An electronic device comprising:
    a case; and
    a flexible board housed in the case; wherein
    the flexible board includes:
        a flexible body including a first main surface and a second main surface; and
        a linear conductor provided at the flexible body so as to be located closer to the first main surface than to the second main surface; wherein:
    the flexible body is valley-folded along a line crossing the linear conductor such that the first main surface is located inside of the fold, and is mountain-folded along a line crossing the linear conductor such that the first main surface is located outside of the fold; and an average radius of curvature in an area where the flexible body is mountain-folded is greater than an average radius of curvature in an area where the flexible body is valley-folded.

14. The electronic device according to claim 13, further comprising:
   a first ground conductor provided between the linear conductor and the first main surface; and
   a second ground conductor provided between the linear conductor and the second main surface; wherein
   a distance between the first ground conductor and the linear conductor is smaller than a distance between the second ground conductor and the linear conductor.

15. The electronic device according to claim 14, wherein an area where the first ground conductor and the linear conductor face each other is smaller than an area where the second ground conductor and the linear conductor face each other.

16. The electronic device according to claim 14, wherein the first ground conductor contains no openings and the second ground conductor includes openings.

17. The electronic device according to claim 2, wherein the linear conductor, the first ground conductor and the second ground conductor define a triplate structure.

18. The electronic device according to claim 13, wherein the flexible body is made of thermoplastic resin.

19. The electronic device according to claim 13, wherein the flexible body includes a first protective layer, a plurality of dielectric sheets, and a second protective layer laminated on each other.

20. The electronic device according to claim 13, wherein the linear conductor is a signal line.

\* \* \* \* \*